(12) United States Patent
Wathen et al.

(10) Patent No.: US 9,473,106 B2
(45) Date of Patent: Oct. 18, 2016

(54) THIN-FILM BULK ACOUSTIC WAVE DELAY LINE

(75) Inventors: Adam Wathen, Atlanta, GA (US);
William Hunt, Decatur, GA (US);
Farasat Munir, Atlanta, GA (US);
Kyle Spencer Davis, Atlanta, GA (US);
James Geoffrey Maloney, Marietta, GA (US); Ryan Sloan Westafer, Fayetteville, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 759 days.

(21) Appl. No.: 13/530,029

(22) Filed: Jun. 21, 2012

(65) Prior Publication Data

US 2013/0162369 A1 Jun. 27, 2013

Related U.S. Application Data

(60) Provisional application No. 61/499,289, filed on Jun. 21, 2011.

(51) Int. Cl.
*H03H 9/00* (2006.01)
*H03H 9/30* (2006.01)
*H03H 9/54* (2006.01)

(52) U.S. Cl.
CPC ..................... *H03H 9/30* (2013.01)

(58) Field of Classification Search
CPC ............ H03H 9/36; H03H 9/15; H03H 9/54; H03H 9/02
USPC ................. 333/141, 149, 187–191
See application file for complete search history.

(56) References Cited

U.S. PATENT DOCUMENTS

| | | | |
|---|---|---|---|
| 2,672,590 A | 3/1954 | McSkimin | |
| 2,913,680 A | 11/1959 | Porter et al. | |
| 2,927,284 A | 3/1960 | Worrell et al. | |
| 3,200,354 A | 8/1965 | White | |
| 3,258,767 A | 6/1966 | Jacobsen | |
| 3,465,177 A | 9/1969 | Winslow et al. | |
| 3,497,727 A | 2/1970 | Klerk et al. | |
| 3,591,789 A | 7/1971 | Hoffman et al. | |

(Continued)

FOREIGN PATENT DOCUMENTS

GB    1270014    4/1972

*Primary Examiner* — Dean Takaoka
(74) *Attorney, Agent, or Firm* — Troutman Sanders LLP; Ryan A. Schneider; Christopher C. Close, Jr.

(57) ABSTRACT

A thin-film bulk acoustic wave delay line device providing true-time delays and a method of fabricating same. An exemplary device can comprise several thin-film layers including thin-film transducer layers, thin-film delay layers, and stacks of additional thin-film materials providing acoustic reflectors and matching networks. The layer material selection and layer thicknesses can be controlled to improve impedance matching between transducers and the various delay line materials. For example, the transducer layers and delay layers can comprise piezoelectric and amorphous forms of the same material. The layers can be deposited on a carrier substrate using standard techniques. The device can be configured so that mechanical waves propagate solely within the thin films, providing a substrate-independent device. The device, so constructed, can be of a small size, e.g. 40 μm per side, and capable of handling high power levels, potentially up to 20 dBm, with low insertion loss of approximately 3 dB.

18 Claims, 4 Drawing Sheets

(56) References Cited

U.S. PATENT DOCUMENTS

| | | | |
|---|---|---|---|
| 3,689,784 A | 9/1972 | de Klerk | |
| 3,769,615 A | 10/1973 | de Klerk | |
| 3,857,113 A | 12/1974 | Huang | |
| 3,942,139 A | 3/1976 | Cooper et al. | |
| 3,952,269 A | 4/1976 | Bristol | |
| 4,099,147 A | 7/1978 | McAvoy | |
| 4,119,934 A | 10/1978 | Weglein et al. | |
| 4,401,946 A | 8/1983 | Klimstra | |
| 5,365,203 A | 11/1994 | Nakamura et al. | |
| 6,031,847 A | 2/2000 | Collins et al. | |
| 6,720,844 B1* | 4/2004 | Lakin | 333/189 |
| 6,878,604 B2* | 4/2005 | Aigner | H01L 37/02 310/311 |
| 6,917,261 B2* | 7/2005 | Unterberger | 333/189 |
| 6,943,647 B2* | 9/2005 | Aigner et al. | 333/187 |
| 6,963,257 B2* | 11/2005 | Ella et al. | 333/133 |
| 7,079,615 B2 | 7/2006 | Bailey | |
| 7,466,213 B2* | 12/2008 | Lobl | H03H 3/04 310/322 |
| 7,474,174 B2* | 1/2009 | Milsom | H03H 9/564 333/133 |
| 7,491,569 B2* | 2/2009 | Fattinger et al. | 438/53 |
| 7,548,139 B2* | 6/2009 | Park et al. | 333/187 |
| 7,728,485 B2* | 6/2010 | Handtmann et al. | 310/320 |
| 8,076,999 B2* | 12/2011 | Schmidhammer | 333/187 |
| 8,330,325 B1* | 12/2012 | Burak | H03H 9/585 310/320 |
| 8,531,083 B2* | 9/2013 | Sinha et al. | 310/320 |
| 2009/0079521 A1* | 3/2009 | Heinze et al. | 333/202 |
| 2009/0295506 A1* | 12/2009 | Handtmann et al. | 333/192 |
| 2009/0309677 A1* | 12/2009 | Schmidhammer | 333/195 |
| 2011/0193656 A1 | 8/2011 | Erb et al. | |

* cited by examiner

THIN-FILM BULK ACOUSTIC WAVE DELAY LINE

CROSS-REFERENCE TO RELATED APPLICATIONS

This application claims a benefit, under 35 U.S.C. §119 (e), of U.S. Provisional Application Ser. No. 61/499,289, filed Jun. 21, 2011, the entire contents and substance of which are hereby incorporated by reference.

BACKGROUND

1. Technical Field

Various embodiments of the disclosed technology relate to acoustic delay lines and, more particularly, devices providing bulk acoustic wave delay lines and methods of fabricating such devices.

2. Description of Related Art

Wideband reconfigurable true time delays (TTD) are desired components for a wide variety of high frequency (e.g., GHz-range) applications including phased array radars, electronic filters and countermeasure systems, and digital systems where precise delays are needed to increase effective sampling and processing rates in a large frequency range. However, existing TTD devices are typically expensive, bulky, high loss, or have relatively slow reconfiguring speed.

Acoustic delay lines have been used extensively in signal processing applications to provide TTD. Two common types of acoustic delay line are the surface acoustic wave (SAW) delay line and the bulk acoustic wave (BAW) delay line. Devices providing SAW delay lines are frequency limited by the spacing of the interdigital transducers used to excite the SAW and can be difficult to fabricate in the GHz range as the insertion loss typically increases significantly with frequency.

BAW devices inherently have lower insertion losses as compared with their SAW counterparts but are frequency limited by transducer layer thickness. With early BAW delay line devices, large delays (e.g., 1 microsecond) were desired so thick substrates were used to convey and delay the acoustic waves, as in U.S. Pat. No. 4,099,147These designs suffer from significant diffraction and material losses. Moreover, such designs are not compatible with wafer-scale fabrication processes for low-cost high-volume production.

Modern BAW delay line devices typically rely on long or complicated BAW propagation paths to achieve a desired signal delay. For example, some of these devices are fabricated with angled acoustic reflecting surfaces, as in U.S. Pat. No. 2,672,590Other BAW devices employ a series of two-port delay line devices fabricated on a slanted multifaceted solid to achieve differing delay times among transducers, as in U.S. Pat. No. 2,927,284However, fabricating precise angled acoustic reflecting surfaces and slanted substrates is difficult for high frequency applications. Also, as the number of unique delays required increases, the overall footprint of conventional delay lines increases to accommodate placement of additional devices.

SUMMARY

There is a need for bulk acoustic wave bulk acoustic wave delay line devices that provide nanosecond-scale true-time delays with high power handling capability and low insertion loss in a compact package. Preferably, the dimensions of such devices are on the order of tens of microns per side or less.

There is also a need for substrate-independent bulk acoustic wave delay line devices that do not rely on propagating acoustic energy in a substrate, rod, or other bulky medium. Preferably, such devices are small surface-mount devices (SMD) capable of being integrated into passive and active systems, whether the substrate is insulating, semiconducting, or conducting.

There is a further need for simple, scalable, and inexpensive methods of fabricating such bulk acoustic wave delay line devices.

Exemplary embodiments of the disclosed technology include thin-film bulk acoustic wave delay line devices and methods of fabricating thin-film bulk acoustic wave delay line devices. According to an exemplary embodiment, a thin-film bulk acoustic wave delay line device can have at least one input transducer layer for converting input electrical signals to mechanical waves, at least one output transducer layer for converting the mechanical waves to output electrical signals, and at least one delay layer. Each of the input transducer layers and each of the output transducer layers can include a thin-film transducer positioned between a pair of electrode layers. Each electrode layer can have one or more input and output electrodes.

Each input and output electrode can be one or more metal films. Each of the delay layers can include a thin-film delay medium. The delay layers can be adjacent to a first input transducer layer and adjacent to a first output transducer layer.

In another embodiment, the device can also include a substrate for carrying the input transducer layers, the output transducer layers, and the delay layers. In a further embodiment, the substrate can receive and terminate incident energy of the mechanical waves to reduce undesired reflections.

In another embodiment, the first input transducer layer can also be the first output transducer layer. The device can also include a thin-film acoustic reflector stack positioned between the substrate and the first input transducer layer.

In another embodiment, the first delay layer can be positioned between the first input transducer layer and the first output transducer layer. The device can also include a thin-film acoustic matching network between the substrate and the first input transducer layer.

In another embodiment, the thin-film delay mediums and the thin-film transducers can primarily be a first material that can be deposited as a thin film. The thin film delay mediums can be thicker than one-fourth the acoustic wavelength of the first material. The first material can be either zinc oxide (ZnO), aluminum nitride (AlN), or another material with a piezoelectric form. In another embodiment, the thin-film delay mediums can be a non-piezoelectric form of the first material and the thin-film transducers can be a piezoelectric form of the first material. In another embodiment, each delay layer can have the same acoustic impedance or each delay layer can be of the same thickness and material as other delay layers. In an alternate embodiment, the thickness of delay layers can be selected to compensate for delay incurred by conveyance of the mechanical waves through output transducer layers.

In various embodiments, the device can be etched to expose the input and output electrodes. For example, in one embodiment, the input transducer layers, output transducer layers, and delay layers can be etched to progressively smaller lateral dimensions as the distance from the substrate increases. In an alternate embodiment, the input transducer layers, output transducer layers, and delay layers can be deep etched.

In various embodiments, the device can be configured to provide delays on the order of nanoseconds. The device may be no more than approximately 100 μm on a side, and configured to handle power levels up to approximately 20 dBm with substantially low insertion loss.

According to another exemplary embodiment, a thin-film bulk acoustic wave delay line device can have an upper thin-film transducer layer for converting input electrical signals to mechanical waves and a lower thin-film transducer layer for converting the mechanical waves to output electrical signals. A thin-film transducer layer can include a first electrode and a second, electrode and a piezoelectric medium of a first chemical composition and with a substantially high coupling coefficient. The piezoelectric medium can be positioned between the first and second electrodes. An electrode can comprise a plurality of metal layers including a metal layer for adhesion, a metal layer for electrical conductance, and a metal etch-stop layer on regions of the electrode for forming external electrical contacts. The device can also have a thin-film delay layer comprising an amorphous material of the first chemical composition, a thin-film acoustic matching network comprising a plurality of additional thin-film layers, and a substrate for carrying the thin-film transducer layers, the thin-film delay layer, and the thin-film acoustic matching network. The thin-film delay layer can be positioned between the upper and lower thin-film transducer layers, and the thin-film acoustic matching network can be positioned between the substrate and the lower thin-film transducer layer.

According to another exemplary embodiment, a method of constructing a thin-film bulk acoustic wave delay line device can include depositing on a substrate one or more transducer layers and one or more delay layers. A transducer layer can include a thin-film transducer positioned between a pair of electrode layers, each electrode layer comprising one or more input and output electrodes. A delay layer can include a thin-film delay medium.

In another embodiment, the method can further include selective and sequential etching of the transducer layers and delay layers, wherein the transducer layers and delay layers are etched to progressively smaller lateral dimensions to expose the input and output electrodes of the transducer layers.

In an alternative embodiment, the method can further include selective deep anisotropic etching, wherein multiple etching steps are performed at the end of a fabrication process to expose the input and output electrodes of the transducer layers. In a further embodiment, the etching can be wet etching using an acoustically lossy material as a protective mask. The acoustically lossy material can be primarily gold.

In another embodiment, the method can further include removing at least part of the substrate. In a further embodiment, at least part of the substrate can be all of the substrate.

These and other objects, features, and advantages of the thin-film bulk acoustic wave delay line devices and methods for fabricating the same will become more apparent upon reading the following specification in conjunction with the accompanying figures.

DETAILED DESCRIPTION

Figure 1:
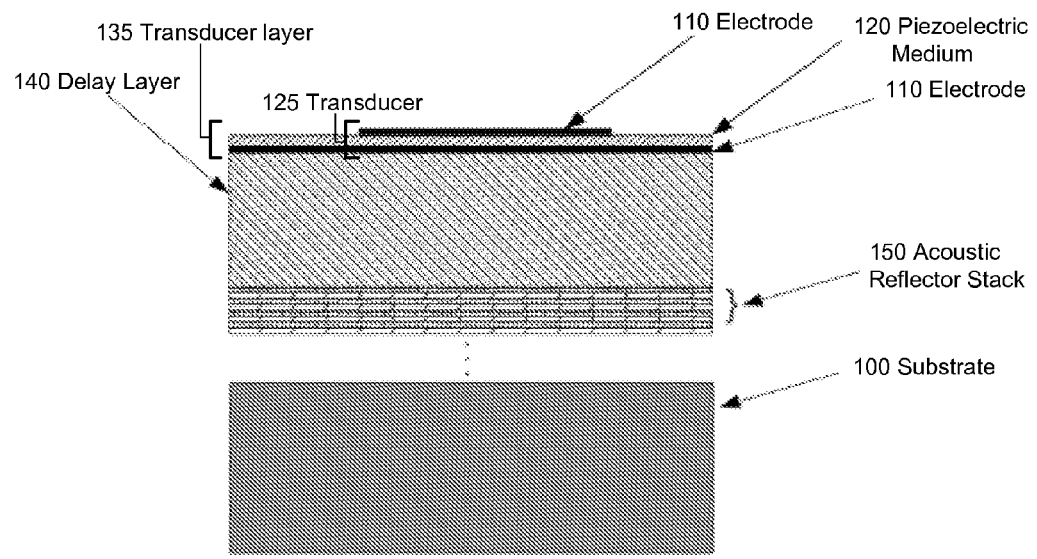
FIG. 1 illustrates a simplified cross-sectional view of a one-port thin-film bulk acoustic wave delay line device comprising several thin films and a substrate, according to an exemplary embodiment of the disclosed technology.

To facilitate an understanding of the principles and features of the disclosed technology, various illustrative embodiments are explained below. Exemplary embodiments of the disclosed technology comprise thin-film bulk acoustic wave delay line devices and methods of fabricating the same.

The components described hereinafter as making up various elements of the disclosed technology are intended to be illustrative and not restrictive. Many suitable components that would perform the same or similar functions as components described herein are intended to be embraced within the scope of the thin-film bulk acoustic wave delay line devices. Such other components not described herein may include, but are not limited to, for example, components developed after development of the disclosed technology. It is also to be understood that the mention of one or more method steps does not preclude the presence of additional method steps or intervening method steps between those steps expressly identified.

I. Overview

The disclosed technology includes thin-film bulk acoustic wave delay line devices providing true-time delays. Exemplary thin-film bulk acoustic wave delay line devices can comprise a plurality of thin-films deposited on an ancillary carrier substrate. Instead of propagating acoustic energy in a substrate, a rod, or other typically bulky medium, the exemplary devices can effectively convey generated acoustic waves solely within the thin films deposited on the carrier substrate. In other words, exemplary thin-film bulk acoustic wave delay line devices can be substrate-independent.

This substrate-independent approach can allow such exemplary devices to be integrated into passive and active systems on insulating, semiconducting, or conducting substrates. Moreover, the exclusive use of thin-film layers can result in devices that are compact (e.g., on the order of 40 μm on a side) with excellent power handling capability (e.g., up to and above approximately 20 dBm) and low insertion loss (e.g., approximately 3 dB). These devices can be fabricated and packaged with relative ease, and can be integrated into systems requiring nanosecond scale time delays in a small space.

Thus, exemplary thin-film bulk acoustic wave delay line devices, which otherwise might be large and bulky components in prior systems, can be compact surface-mount devices (SMD) easily incorporable into various RF and digital modules. Conceived applications include, without limitation: large phased-array systems for transmit/receive beam-steering, retro-reflective antenna array systems, systems for military electronics, time-buffering systems for very high-speed data transmit/receive, microwave integrated circuits for wideband processing, amplifier gain equalization, finite impulse response filters, and miniature wideband delay lines for modern integration into multi-device assemblies.

Referring now to the figures, in which like reference numerals represent like parts throughout the views, various embodiments of disclosed technology will be described in detail.

II. Exemplary Devices

FIG. 1 illustrates a simplified cross-sectional view of a one-port thin-film bulk acoustic wave delay line device comprising several layers of thin films and a substrate 100, according to an exemplary embodiment of the disclosed technology. As shown in FIG. 1, an exemplary device can have at least one thin-film transducer layer 135, at least one thin-film delay layer 140, an acoustic reflector stack 150 comprising a stack of additional thin-film layers, and a carrier substrate 100.

A transducer can convert between electrical signals and acoustic, or mechanical, waves. When a transducer is converting or configured to convert from an electrical signal to an acoustic wave, it is herein referred to as an input transducer. When a transducer is converting or configured to convert from an acoustic wave to an electrical signal, it is herein referred to as an output transducer.

A thin-film transducer 125 can comprise a piezoelectric medium 120 of zinc oxide, aluminum nitride, or another suitable piezoelectric material. A piezoelectric medium can be a piezoelectric material with a high coupling coefficient (e.g., at least few percent). In an exemplary embodiment, the piezoelectric material can be highly-oriented c-axis zinc oxide.

Figure 2:
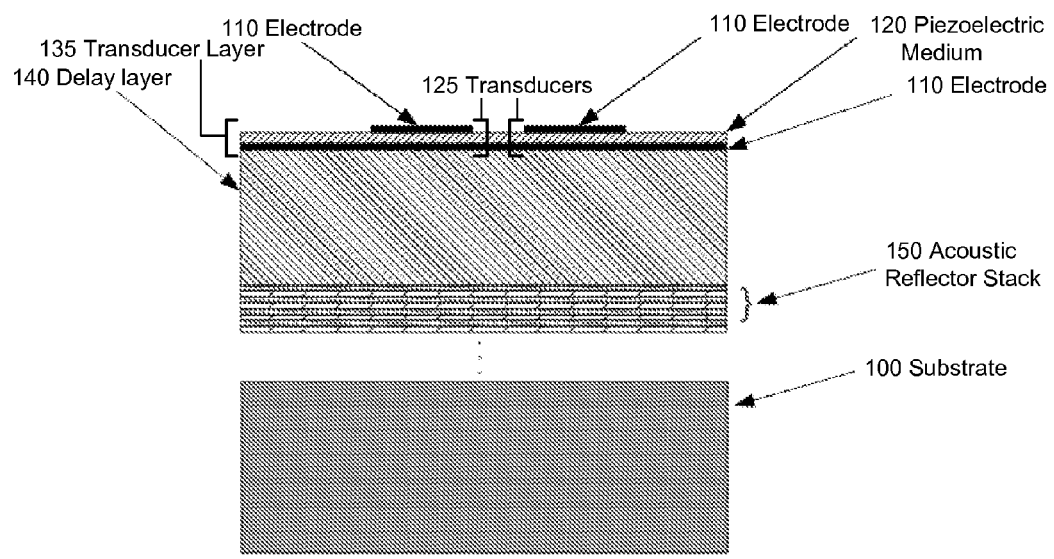
FIG. 2 illustrates a simplified cross-sectional view of a two-port thin-film bulk acoustic wave delay line device, wherein two laterally separated transducers are patterned on the thin film delay material, according to an exemplary embodiment of the disclosed technology.

A piezoelectric medium 120 can be associated with one or more pairs of electrodes. As shown in FIG. 1, a piezoelectric medium 120 can be positioned between a pair of electrodes 110 to form a thin-film transducer 125. As shown in FIG. 2, a piezoelectric medium 120 can be positioned between a first pair of electrodes 110 and a second pair of electrodes 110 to form multiple thin-film transducers 125. Thus, a thin-film transducer 135 layer can comprise one or more thin-film transducers.

In an exemplary device, an electrode can comprise a thin metal film of molybdenum or another suitable conductor. In some embodiments, an electrode can comprise a plurality of films as necessary for improvement of layer adhesion, electrical conductivity, acoustic performance, or a combination of these. For example, an electrode can comprise a first metal layer of chromium for adhesion, and a second metal layer, aluminum, for electrical conductivity.

An exemplary device can further include one or more thin-film delay layers. A thin-film delay layer can primarily comprise a delay medium. FIG. 1 illustrates an exemplary device having a single thin-film delay layer 140. However, exemplary devices can have arbitrary numbers of homogenous or heterogeneous stacks of delay layers. The delay layers can comprise specially designed thin-film materials configured to achieve a specific acoustic impedance and time delay, individually or in combination. For example, in an exemplary device, each delay layer can be of a same material, thickness, and/or acoustic impedance. Alternatively, the thickness of each delay layer can be selected to compensate for delay incurred by conveyance of the mechanical waves through transducer layers. In an exemplary embodiment, the thin-film delay layers can be at least as thick as one-fourth the acoustic wavelength of the lowest frequency acoustic wave to be transmitted through the delay layers.

In exemplary embodiments, a delay layer can comprise the same material, or have the same chemical composition, as a transducer layer. For example, a thin-film transducer layer can comprise a piezoelectric form of a material, and a delay layer can be an amorphous, or non-piezoelectric form of the same material. This can cause the delay layer to have approximately the same acoustic impedance as the similarly composed transducer. In an exemplary device, a thin-film tranducer can comprise highly-oriented c-axis zinc oxide, and a thin-film delay layer can comprise amorphous zinc oxide.

Cascading thin film delay mediums and thin film transducers can allow multiple delays to be derived from the same input signal within the same overall footprint. For example, an exemplary device can have a total transducer footprint of 40 microns per side. Achieving a similar number of unique delays with the same device footprint is likely infeasible with conventional bulk acoustic wave delay line devices.

An exemplary device can further comprise stacks of additional thin-film layers for controlling the propagation of acoustic waves within a layered thin-film structure. For example, as shown in FIG. 1, a plurality of additional thin-film layers can serve as an acoustic reflector 150. In another exemplary device, a plurality of additional thin-film layers can serve as an acoustic matching network. The desired delay, bandwidth, and loss characteristics of an exemplary device can determine the selection of the additional thin-film layer materials, thicknesses, and other properties.

An exemplary device can further comprise a substrate for supporting the thin-film layers of the device. As shown in FIG. 1, the thin-film layers can be carried by the substrate 100. In an exemplary device, instead of propagating acoustic energy in the substrate, the device can effectively convey generated acoustic waves solely within the thin-films layers. In other words, the substrate is not involved in conveying the acoustic waves from input transducers to output transducers. This substrate-independent approach enables thin-film bulk acoustic wave delay line devices to be fabricated so that the substrate has no substantial effect on device performance. Thus, exemplary devices can be integrated into passive and active systems on arbitrary substrates. In an exemplary device, the substrate can be a silicon wafer.

Though an exemplary device may not require a specific substrate material, the properties of a chosen stack of additional thin-film layers can be related to the properties of the carrier substrate. For example, it may be beneficial to select the thin-film layers of a stack serving as an acoustic matching network based on properties of the carrier substrate.

In an exemplary device, an electrical signal can be applied as a potential difference across electrodes to cause an associated input thin-film transducer to convert the electrical signal to a high frequency (e.g., GHz) acoustic, or mechanical, wave that can propagate into an adjacent thin-film delay layer. The acoustic propagation velocity can be roughly 5 orders of magnitude lower than the electromagnetic propagation velocity. Thus, relatively small distances (order of 10 microns) can provide delay times in the nanosecond range. An electrical output signal can be produced when the acoustic wave arrives at an output thin-film transducer.

In an exemplary embodiment, due to the reciprocal nature of an unpowered device, a transducer and associated electrodes can serve the purpose of electrical input or output. Thus, as shown in FIG. 1, the thin-film transducer 120 can be an input transducer that generates an acoustic wave and also be an output transducer as the generated acoustic wave reflects off the acoustic reflector stack 150 and re-encounters the transducer 120 after propagating through the intermediate delay medium 140.

FIG. 2 illustrates a simplified cross-sectional view of a two-port thin-film bulk acoustic wave delay line device, wherein two laterally separated transducers 125 are patterned on the thin film delay layer 140, according to an exemplary embodiment of the disclosed technology. An exemplary device can have an arbitrary number of output ports limited by the overall thickness of the device and inherent acoustic and diffractive losses in the device.

Figure 3:
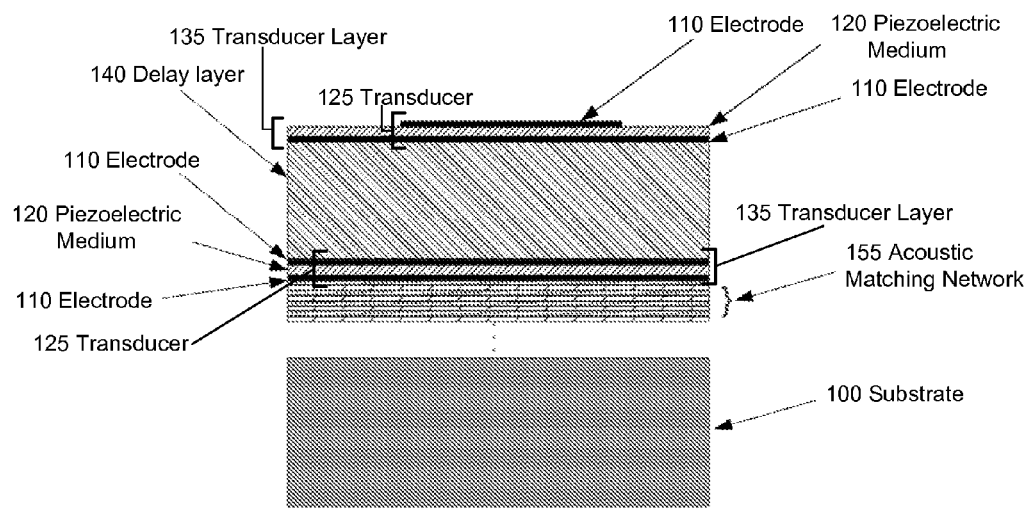
FIG. 3 illustrates a simplified cross-sectional view of a stacked two-port thin-film bulk acoustic wave delay line device comprising an acoustic matching network, according to an exemplary embodiment of the disclosed technology.

FIG. 3 illustrates a simplified cross-sectional view of a stacked two-port device in which an acoustic matching network 155 replaces the acoustic reflector stack of FIGS. 1-2, according to an exemplary embodiment of the disclosed technology. As shown in FIG. 3, an electrical output signal can be produced when an acoustic wave generated by the upper input transducer 125 arrives at the lower output transducer 125.

The exemplary device shown in FIG. 3 is configured so that the substrate 100 has no substantial effect on the device performance. In an exemplary embodiment, the substrate can be configured to receive and terminate incident energy of the mechanical waves to reduce undesired reflections.

Figure 4:
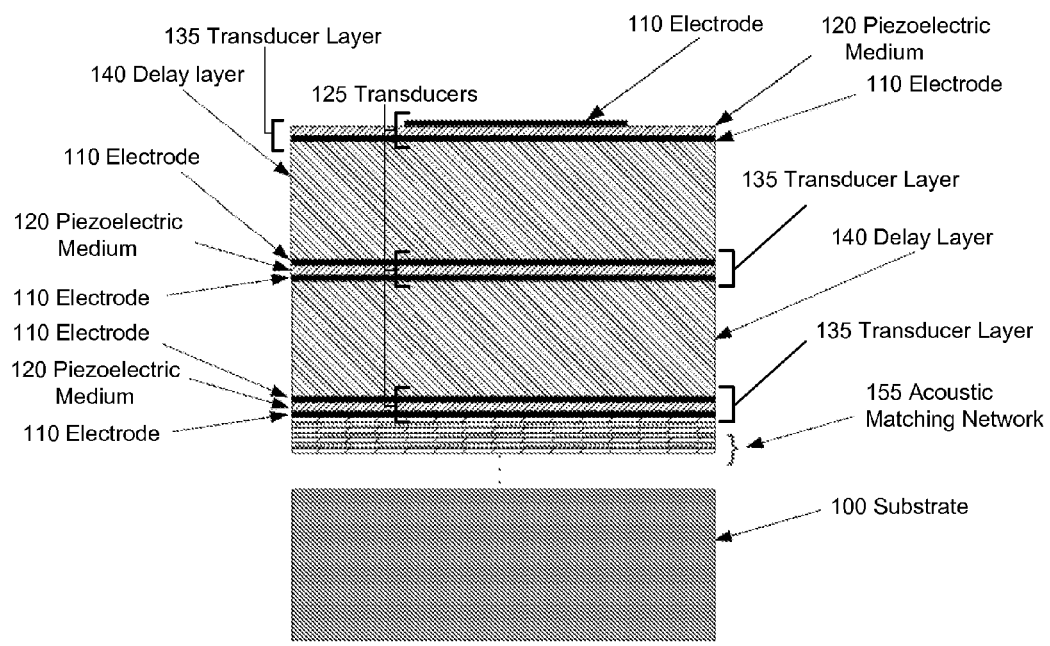
FIG. 4 illustrates a simplified cross-sectional view of a stacked three-port thin-film bulk acoustic wave delay line device having multiple delay and transducer layers, according to an exemplary embodiment of the disclosed technology.

FIG. 4 illustrates a simplified cross-sectional view of a three-port device having multiple delay and transducer layers of the kind shown in FIG. 3, according to an exemplary embodiment of the disclosed technology. However, in the exemplary device as shown by FIG. 4, the initial wave can interact one or more times with several transducers 125. This configuration can enable creation of finite impulse response (FIR) filters by way of different delay times, amplitudes, phases, or a combination thereof. These can be controlled by one or more of a choice of material and thickness for each layer. If the delay material thicknesses are equal, as in FIG. 4, the true time delay for propagation from top transducer to each transducer beneath is approximately an integer multiple of the delay of a single layer. Thicknesses of layers, such as the delay layers 140 can be chosen to compensate for additional delay incurred by transit through intermediate transducer layers 135.

III. Exemplary Methods of Fabrication

A method of fabricating a thin-film bulk acoustic wave delay line device can comprise growing on a substrate at least one thin-film transducer layer and at least one thin-film delay layer. The method can further include growing one or more stacks of additional thin-film layers to serve, for example and not limitation, as acoustic reflector stacks or matching networks.

Each type of thin-film layer can be deposited using known techniques in the art. Suitable techniques can include, for example and not limitation, sputtering, evaporation, chemical vapor deposition, and atomic layer deposition. Suitable materials can include materials that are capable of being deposited or grown on a substrate.

In further embodiments, various fabrication techniques can be used to expose and interconnect the electrodes at different layers of a thin-film bulk acoustic wave delay line device structure. In an exemplary embodiment, the method can further comprise etching one or more of the thin-film layers to expose the electrodes for interconnect.

The layers can be etched with standard etching techniques known in the art, for example and not limitation, wet etching using a protective mask. In an exemplary embodiment, a protective mask can be a polymer photoresist material.

Certain metals resist etching by certain etchants. In an exemplary embodiment, the etching of an electrode can be inhibited by incorporating a layer of a certain metal, such as gold. Although gold can be an acoustically lossy material, the layer need only be thick enough to stop an etch. When an acoustically lossy material is used, the impact on acoustic performance can be reduced by reducing the thickness of the layer.

In an exemplary embodiment, the etch stop metal layer can be patterned so that it covers and protects the electrode metal only where etching occurs, as defined by a protective etch mask. Separate etch masks can be used to reveal the contacts for electrodes at different depths, but some tolerance to over-etching can be provided by metal etch stop layers previously deposited upon metal layers in the etch regions.

Figure 5:
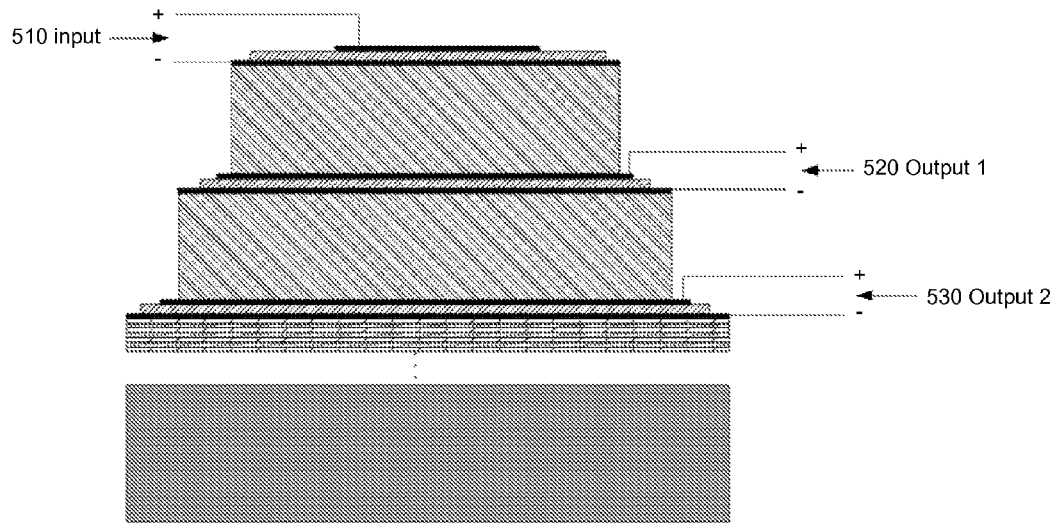
FIG. 5 illustrates a simplified cross-sectional view of a thin-film bulk acoustic wave delay line device wherein the layers are patterned and etched to different lateral dimensions, according to an exemplary embodiment of the disclosed technology.

FIG. 5 illustrates a simplified cross-sectional view of a thin-film bulk acoustic wave delay line device wherein the layers are patterned and etched to different lateral dimensions, according to an exemplary embodiment of the disclosed technology. FIG. 5 illustrates a refinement of devices as shown in FIG. 4 and shows a representative result of a selective and sequential etching approach whereby layers are grown upward from the substrate and etched to progressively smaller lateral dimension. This can expose all input and output electrodes 510, 520, 530 for interconnect.

Figure 6:
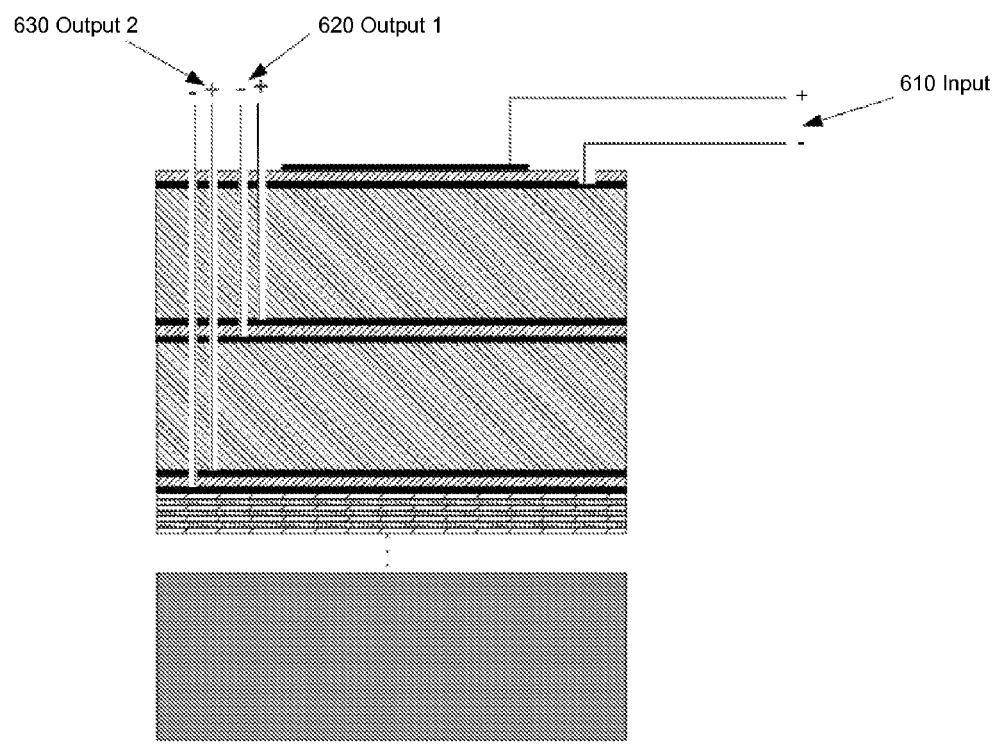
FIG. 6 illustrates a simplified cross-sectional view of a thin film bulk acoustic wave delay line device wherein the layers are etched away only in narrow openings, according to an exemplary embodiment of the disclosed technology.

FIG. 6 illustrates a simplified cross-sectional view of a thin-film bulk acoustic wave delay line device wherein the layers are etched away in narrow openings, according to an exemplary embodiment of the disclosed technology. In exemplary embodiments, vertical interconnect access channels (VIAs) can be fabricated using highly anisotropic etching, milling processes, plating techniques, or a combination thereof. FIG. 6 illustrates a refinement of devices as shown in FIG. 4 and shows a representative result of a selective deep anisotropic etching approach whereby all layers are grown upward from the substrate and multiple etching steps are performed at the end of the fabrication process to enable electrodes 610, 620, 630 to interconnect. Wet etching can also be performed to similar depths, especially when larger surface openings are acceptable.

IV. Experimental Results

Figure 7:
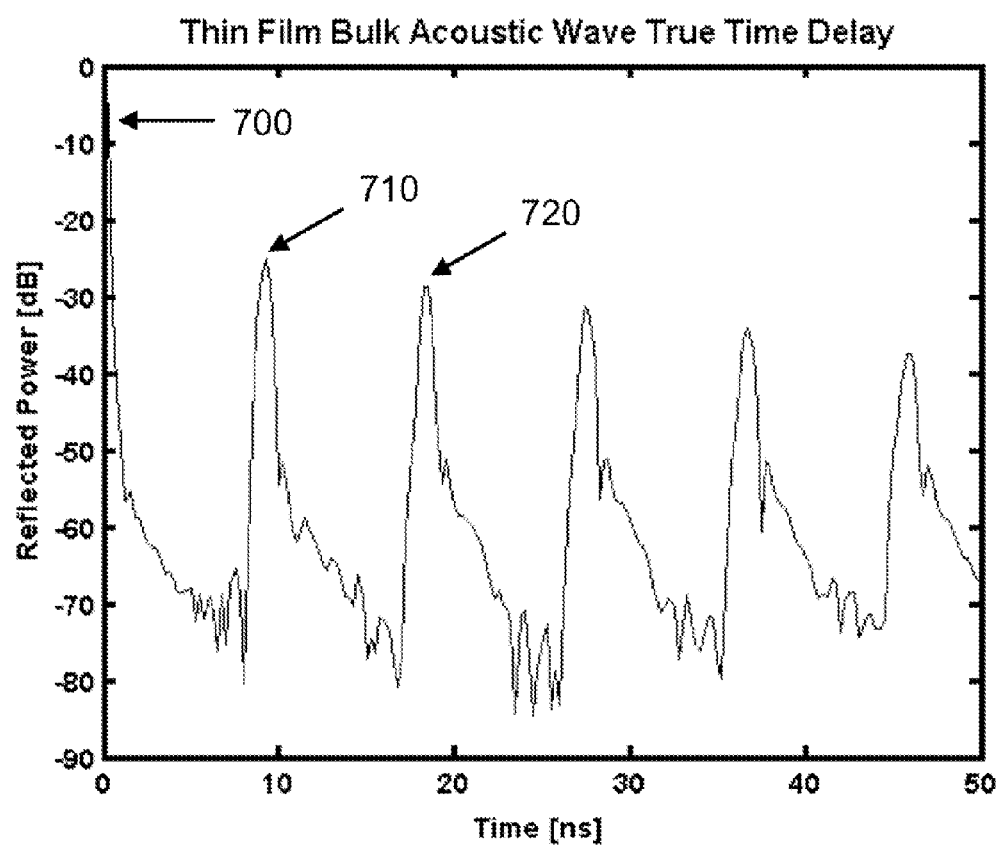
FIG. 7 illustrates a plot of relative reflected power versus time for a thin-film bulk acoustic wave delay line device, according to an exemplary embodiment of the disclosed technology.

FIG. 7 illustrates a plot of relative reflected power versus time for a thin-film bulk acoustic wave delay line device, according to an exemplary embodiment of the disclosed technology. An experimental device, as illustrated in FIG. 1, was fabricated and tested. The transducer bandwidth and acoustic reflector stack bandwidth were designed to coincide. The measurement result is shown in FIG. 7.

As shown, the initial reflection 700 from the transducer occurred at zero nanoseconds and was followed by multiple delayed echoes 710, 720 due to repeated acoustic propagation in the thin-film layers. Echo 710 was due to a single round-trip transit from transducer to reflector and back. As only a portion of the reflected energy was absorbed by the transducer, echo 710 was not as large the initial reflection 700. Echo 720 resulted from the second round-trip of energy not absorbed by the transducer.

V. Conclusion

As described above, exemplary embodiments of the disclosed technology include thin-film bulk acoustic wave delay line devices and methods of producing same. While the device and method of fabrication have been disclosed in exemplary forms, it will be apparent to those skilled in the art that many modifications, additions, and deletions may be made without departing from the spirit and scope of the device, method, and their equivalents, as set forth in the following claims.

The invention claimed is:

1. A bulk-acoustic-wave delay line device comprising:
   one or more input transducer layers, including a first input transducer layer, for converting input electrical signals to mechanical waves;
   one or more output transducer layers, including a first output transducer layer, for converting the mechanical waves to output electrical signals;
   wherein each of the one or more input transducer layers and each of the one or more output transducer layers comprises a thin-film piezoelectric medium positioned between two electrode layers, each electrode layer comprising one or more electrodes;
   one or more delay layers, including a first delay layer adjacent to the first input transducer layer and adjacent to the first output transducer layer, each delay layer comprising a thin-film delay medium; and
   a substrate for carrying the one or more input transducer layers, the one or more output transducer layers, and the one or more delay layers;
   wherein the thin-film piezoelectric medium comprises a first chemical composition;
   wherein the first delay layer comprises an amorphous material of the first chemical composition; and
   wherein the first delay layer has approximately the same acoustic impedance as the transducer layers.

2. The device of claim 1, wherein the first input transducer layer is the first output transducer layer.

3. The device of claim 1 further comprising a thin-film acoustic reflector stack between the substrate and the first input transducer layer.

4. The device of claim 1 further comprising a thin-film acoustic matching network between the substrate and the first input transducer layer.

5. The device of claim 1, wherein the substrate is configured to receive and terminate incident energy of the mechanical waves to reduce undesired reflections.

6. The device of claim 1, wherein the thin-film delay mediums and the thin-film piezoelectric mediums primarily comprise a first material that can be deposited as a thin film.

7. The device of claim 6, wherein the thin-film delay mediums are at least as thick as $\lambda$ of the first material.

8. The device of claim 6, wherein the thin-film delay mediums are a non-piezoelectric form of the first material.

9. The device of claim 1, wherein the one or more delay layers have a same acoustic impedance.

10. The device of claim 1, wherein the thickness of each of the one or more delay layers is selected to compensate for delay incurred by conveyance of the mechanical waves through output transducer layers.

11. The device of claim 1, wherein the device is no more than approximately 100 μm on a side, and configured to handle power levels up to approximately 20 dBm with low insertion loss.

12. The device of claim 1, configured to provide delays on the order of nanoseconds; and
   wherein the device provides for only a single path of acoustic wave propagation therethrough.

13. A thin-film bulk-acoustic-wave delay line device comprising:
   an upper thin-film transducer layer for converting input electrical signals to mechanical waves;
   a lower thin-film transducer layer for converting the mechanical waves to output electrical signals;
   wherein each of the upper and lower thin-film transducer layers comprise:
     a first electrode and a second electrode;
     wherein each electrode comprises a plurality of metal layers including:
       a metal layer for adhesion;
       a metal layer for electrical conductance; and
       a metal etch-stop layer on regions of the electrode for forming external electrical contacts; and
     a piezoelectric medium of a first chemical composition and with a coupling coefficient positioned between the first and second electrodes; and
   a thin-film delay layer comprising an amorphous material of the first chemical composition and positioned between the upper and lower thin-film transducer layers;
   a thin-film acoustic matching network comprising a plurality of additional thin-film layers and positioned between a substrate and the lower thin-film transducer layer; and
   the substrate for carrying the thin-film transducer layers, the thin-film delay layer, and the thin-film acoustic matching network;
   wherein thin-film delay layer has approximately the same acoustic impedance as each of the upper and lower thin-film transducer layers.

14. A bulk-acoustic-wave delay line device comprising:
   an input transducer layer for converting input electrical signals to mechanical waves;
   an output transducer layer for converting the mechanical waves to output electrical signals;
   wherein the input transducer layer and the output transducer layer each comprise a thin-film piezoelectric medium comprising a first chemical composition positioned between two electrode layers, each electrode layer comprising an electrode; and
   a delay layer comprising an amorphous material of the first chemical composition, the delay layer adjacent the input transducer layer and the output transducer layer, the delay layer comprising a thin-film delay medium;
   wherein the delay layer has approximately the same acoustic impedance as the transducer layer.

15. The device of claim 14 further comprising a thin-film acoustic reflector stack.

16. The device of claim 14 further comprising a thin-film acoustic matching network.

17. The device of claim 14, wherein the thickness of the delay layer is selected to compensate for delay incurred by conveyance of the mechanical waves through the output transducer layer.

18. The device of claim 14, wherein the device is no more than approximately 100 μm on a side, and configured to handle power levels up to approximately 20 dBm with low insertion loss.

* * * * *